(12) United States Patent
Chang (10) Patent No.: US 6,440,842 B1
(45) Date of Patent: Aug. 27, 2002

(54) METHOD OF FORMING A DUAL DAMASCENE STRUCTURE BY PATTERNING A SACRIFICIAL LAYER TO DEFINE THE PLUG PORTIONS OF THE STRUCTURE

(75) Inventor: Ching-Yu Chang, I-Lan Hsien (TW)

(73) Assignee: Macronix International Co. Ltd., Hsin-Cui (TW)

( * ) Notice: Subject to any disclaimer, the term of this patent is extended or adjusted under 35 U.S.C. 154(b) by 0 days.

(21) Appl. No.: 09/851,575

(22) Filed: May 10, 2001

(30) Foreign Application Priority Data

Feb. 2, 2001 (TW) .......................................... 090102185

(51) Int. Cl.$^7$ .......................................... H01L 21/4763
(52) U.S. Cl. ........................ 438/633; 438/638; 438/675
(58) Field of Search .................................. 438/638, 633, 438/672, 675

(56) References Cited

U.S. PATENT DOCUMENTS

| | | | | |
|---|---|---|---|---|
| 6,033,977 A | * | 3/2000 | Gutsche et al. | 438/618 |
| 6,174,804 B1 | * | 1/2001 | Hsu | 438/638 |
| 6,284,641 B1 | * | 9/2001 | Parekh | 438/618 |
| 6,309,957 B1 | * | 10/2001 | Tu et al. | 438/622 |

OTHER PUBLICATIONS

A Kajita et al., "A Fully Integrated Pillar Process for High Performance Cu Interconnect Scheme," Proceedings of the 1999 IEEE International Conference on Interconnect Technology, May 1999, pp. 259–261.*

* cited by examiner

Primary Examiner—Olik Chaudhuri
Assistant Examiner—Stephen W. Smoot
(74) Attorney, Agent, or Firm—Winston Hsu

(57) ABSTRACT

A semiconductor wafer comprises a substrate, and a conductive area positioned on a predetermined area of the substrate. A sacrificial layer is formed on the surface of the substrate. A patterned first photoresist layer is formed on the surface of the sacrificial layer, covering the conductive area, followed by removal of the sacrificial layer not covered by the first photoresist layer. A dielectric layer is formed on the surface of the substrate, and a second photoresist layer is formed on the surface of the dielectric layer. A line-shaped opening is formed in the second photoresist layer, followed by etching portions of the dielectric layer through the line-shaped opening for forming a line-shaped recess. The second photoresist layer and the remaining sacrificial layer are completely removed for forming a plug hole in the bottom of the line-shaped recess. Finally, a metal conductive wire and a conductive plug are formed in the line-shaped recess and in the plug hole, with the metal conductive wire coupled with the conductive plug defining a dual damascene structure.

4 Claims, 12 Drawing Sheets

METHOD OF FORMING A DUAL DAMASCENE STRUCTURE BY PATTERNING A SACRIFICIAL LAYER TO DEFINE THE PLUG PORTIONS OF THE STRUCTURE

BACKGROUND OF THE INVENTION

1. Field of the Invention

The present invention relates to a method of forming a dual damascene structure on a semiconductor wafer.

2. Description of the Prior Art

A dual damascene process is a method of forming a conductive wire coupled with a via plug. The dual damascene structure is used to connect devices and wires in a semiconductor wafer and is insulated from other devices by an inter-layer dielectrics (ILD) around it. At the end of the dual damascene process, a chemical mechanical polishing (CMP) process is always performed to planarize the surface of the semiconductor wafer so that subsequent deposition and photolithographic processes perform well on the wafer, resulting in good multilevel interconnects being formed. As a result, the dual damascene structure is widely used in the manufacturing of integrated circuits. As integrated circuit technology advances, improving the yield of the dual damascene structure is an important challenge in the manufacturing of integrated circuits at the present time.

Figure 1:
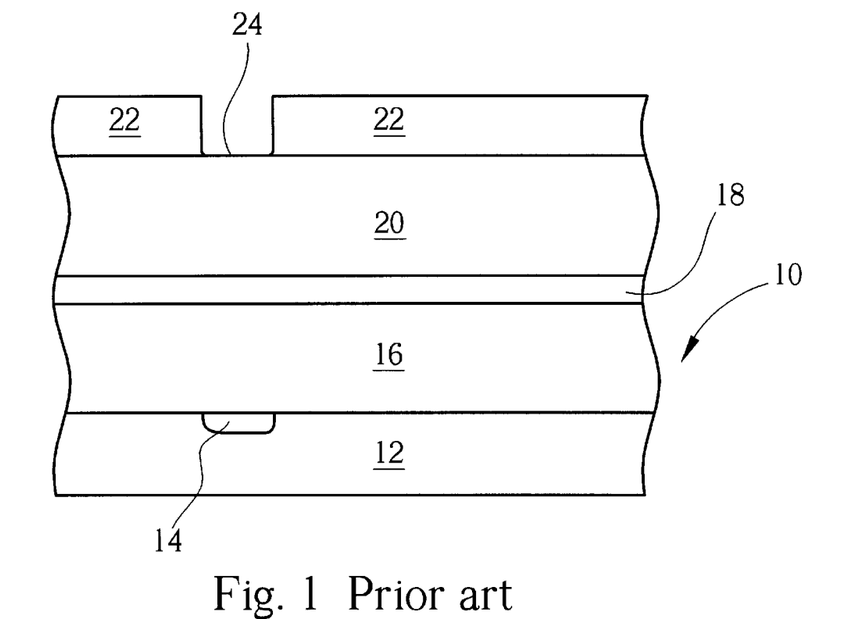
FIG. 1 to FIG. 6 are schematic diagrams of the process of forming a dual damascene structure on a semiconductor wafer according to the prior art.

Please refer to FIG. 1 to FIG. 6. FIG. 1 to FIG. 6 are schematic diagrams of a process of forming a dual damascene structure 42 on a semiconductor wafer 10 according to the prior art. As shown in FIG. 1, the semiconductor wafer 10 comprises a substrate 12, a conductive layer 14 positioned on a predetermined area of the substrate 12, a first inter layer dielectric (ILD) 16 formed of silicon oxide and positioned on the substrate 12 and the conductive layer 14, a silicon nitride (SiN) layer 18 positioned on the ILD 16, and a second inter layer dielectric (ILD) 20 formed of silicon oxide and positioned on the silicon nitride layer,18. The ILD 16, the silicon nitride layer 18 and the ILD 20 are deposited serially using plasma-enhanced chemical vapor deposition (PECVD).

Figure 2:
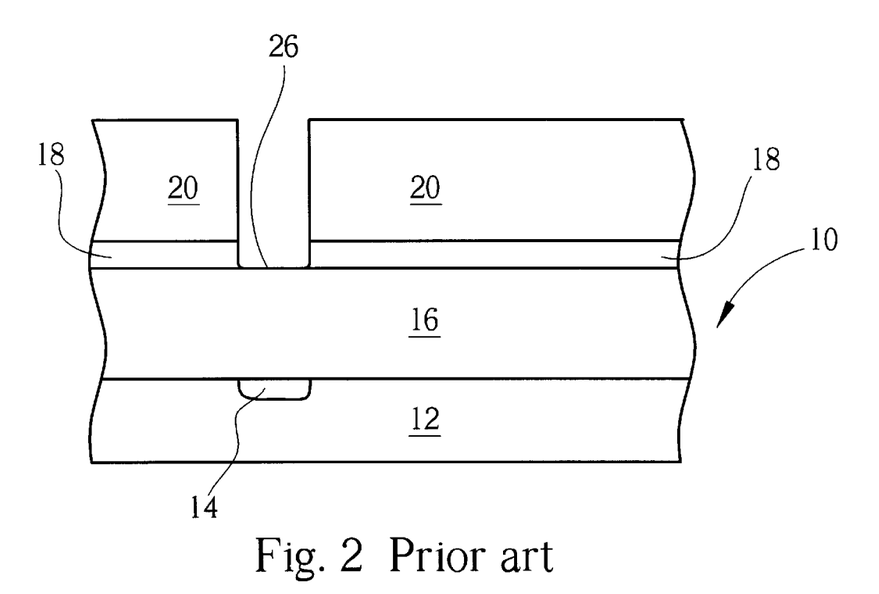

In the prior art method of forming the dual damascene structure 42, a lithographic process is performed first to form a photoresist layer 22 evenly on the ILD 20 with an opening 24 positioned above the conductive layer 14, which extends down to the ILD 20. The opening 24 is used to define the via pattern. As shown in FIG. 2, an anisotropic dry-etching process is then performed along the opening 24 to vertically remove the ILD 20 and the silicon nitride layer 18 positioned under the opening 24 down to the ILD 16, which forms a hole 26. Then, a resist stripping process is performed to completely remove the first photoresist layer 22.

Figure 3:
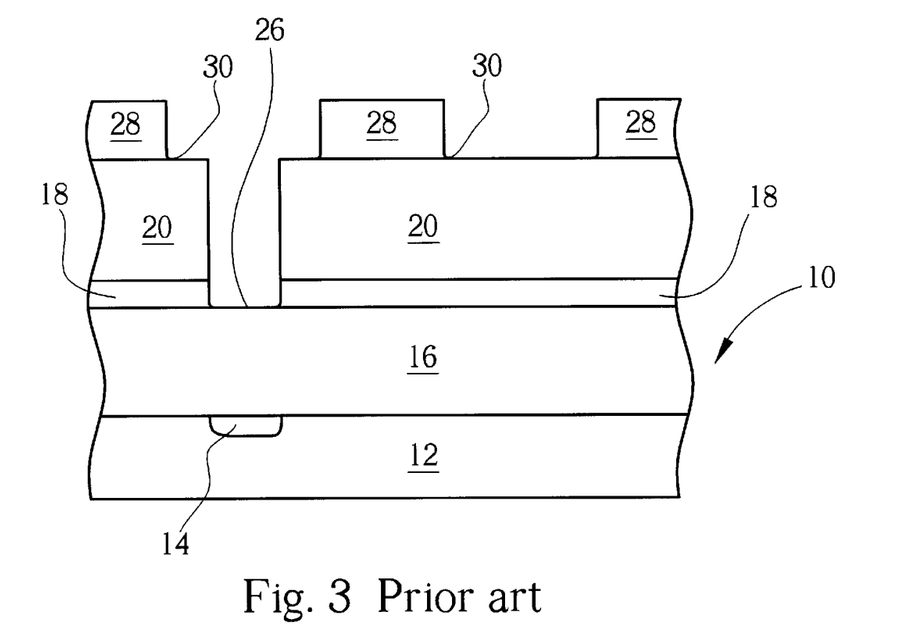
Figure 4:
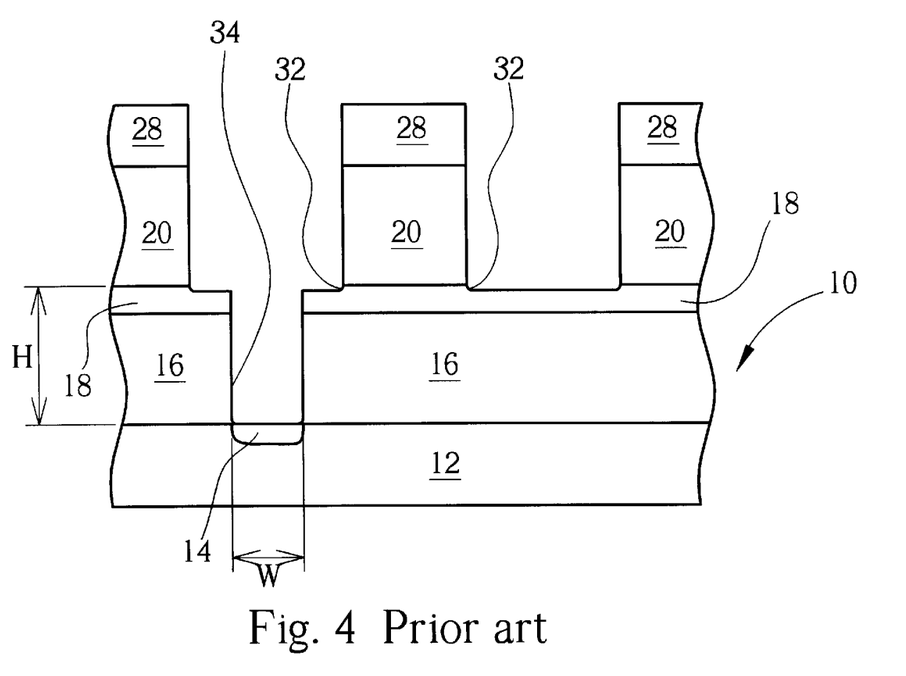

As shown in FIG. 3, a lithographic process is performed again to form a photoresist layer 28 evenly on the ILD 20 with two line-shaped openings 30 in the photoresist layer 28 so as to define the wiring line pattern for connecting transistors. As shown in FIG. 4, a dry-etching process is then performed along the line-shaped openings 30 and hole 26 to vertically remove the ILD 20 and ILD 16 positioned under the openings 30 and the hole 26 down to the silicon nitride layer 18 and the substrate 12, so as to form two line-shaped recesses 32 and a via hole 34.

Figure 5:
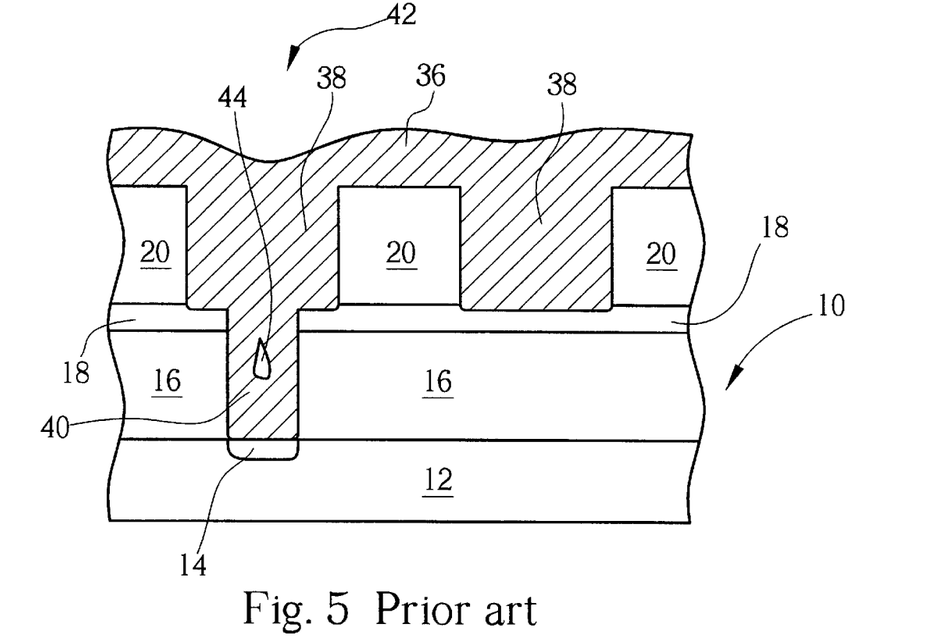
Figure 6:
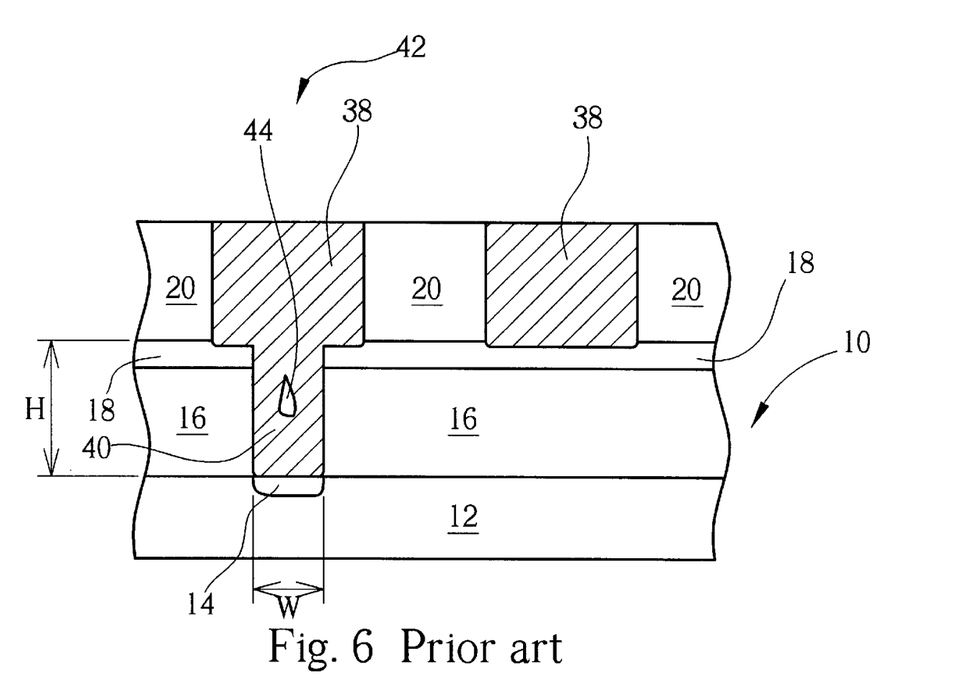

As shown in FIG. 5, the photoresist layer 28 is then removed completely. A metallic layer 36 is deposited on the semiconductor wafer 10 so as to fill the line-shaped recesses 32 and the via hole 34 to form conductive wires 38 and a via plug 40. As shown in FIG. 6, a chemical mechanical polishing (CMP) process is employed to remove the metallic layer 36 positioned on the ILD 20 and to align the upper surface of the conductive wire 38 with the surface of the ILD 20, completing the dual damascene structure 42.

In the prior art method of forming the dual damascene structure 42, the width (W) at the bottom of the via hole 34 is much smaller than the depth of the hole (H), so the via hole 34 has a high aspect ratio. When the via hole 34 is filled with the metallic layer 36, the metallic layer 36 will overhang from the upper corners of the via hole 34 and further restrict the hole 34, causing voids 44 to form inside the via plug 40. The resistance of the via plug 40 will increase because of the voids 44 in the via plug 40, resulting in an unstable electrical current in the dual damascene structure 42, which can affect the electrical performance of an integrated circuit. Furthermore, because of the voids 44 inside the via plug 40, the structure of the dual damascene may be weakened and so more easily damaged in subsequent processes.

SUMMARY OF THE INVENTION

It is therefore a primary objective of the present invention to provide a method of forming a dual damascene structure on a semiconductor wafer for preventing the formation of voids in the via plug of the dual damascene structure.

The method of present invention is to first form a sacrificial layer on the surface of the substrate. Then, a patterned first photoresist layer is formed on the surface of the sacrificial layer covering, the conductive area, followed by removal of the sacrificial layer not covered by the first photoresist layer. Thereafter, a dielectric layer is formed on the surface of the substrate, and the second photoresist layer is formed on the surface of the dielectric layer. A line-shaped opening is formed in the second photoresist layer positioned above the remaining sacrificial layer. Portions of the dielectric layer are etched through the line-shaped opening for forming a line-shaped recess, followed by the second photoresist layer and the remaining sacrificial layer being completely removed, for forming a plug hole in the bottom of the line-shaped recess. Thereafter, a metal layer is formed on the surface of the semiconductor wafer filling the line-shaped recess and the plug hole for forming a metal conductive wire and a conductive plug in the line-shaped recess and in the plug hole. The metal conductive wire coupled with the conductive plug is defined as a dual damascene structure. Finally, the metal layer positioned on the top surface of the dielectric layer is removed to finish the process of the dual damascene structure.

The present invention method of forming a dual damascene structure can form a via plug with a fine structure and prevent the formation of voids in the plug hole when filling the metal layer in the plug hole by a prior art method.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 7:
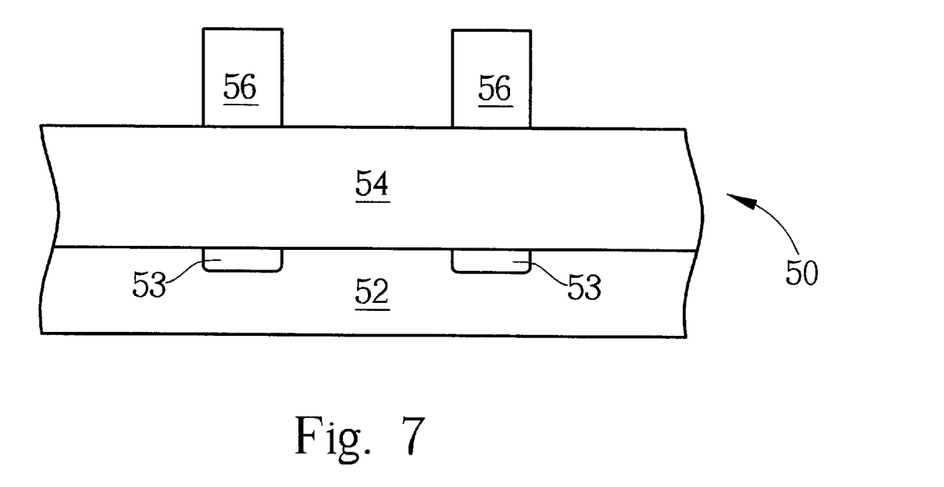
FIG. 7 to FIG. 13 are schematic diagrams of a first embodiment of the present invention method for forming a dual damascene structure.

Please refer to FIG. 7 to FIG. 13. FIG. 7 to FIG. 13 are schematic diagrams of the present invention method for forming a dual damascene structure on a semiconductor wafer 50. As shown in FIG. 7, the semiconductor wafer 50 comprises a substrate 52 and a conductive area 53 positioned on a predetermined area of the substrate 52. The conductive area 53 may be a metal conductive wire, a landing pad, a gate, a source or a drain formed on the semiconductor wafer 50.

Figure 8:
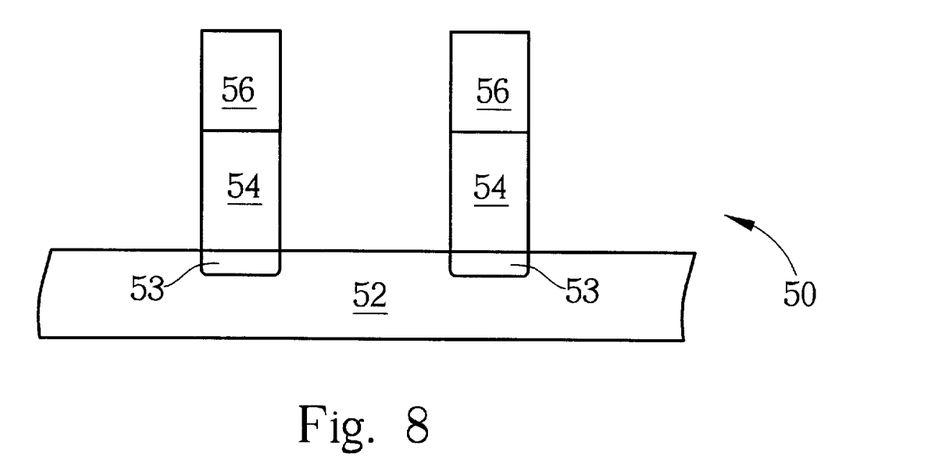

The method of the present invention is to first form a sacrificial layer 54 composed of silicon oxide on the surface of the substrate 52, covering the conductive area 53. Then a patterned photoresist layer 56 is formed on the surface of the sacrificial layer 54, and the photoresist layer 56 is positioned above the conductive area 53. As shown in FIG. 8, a dry-etching process is performed to remove the sacrificial layer 54 not covered by the photoresist layer 56.

Figure 9:
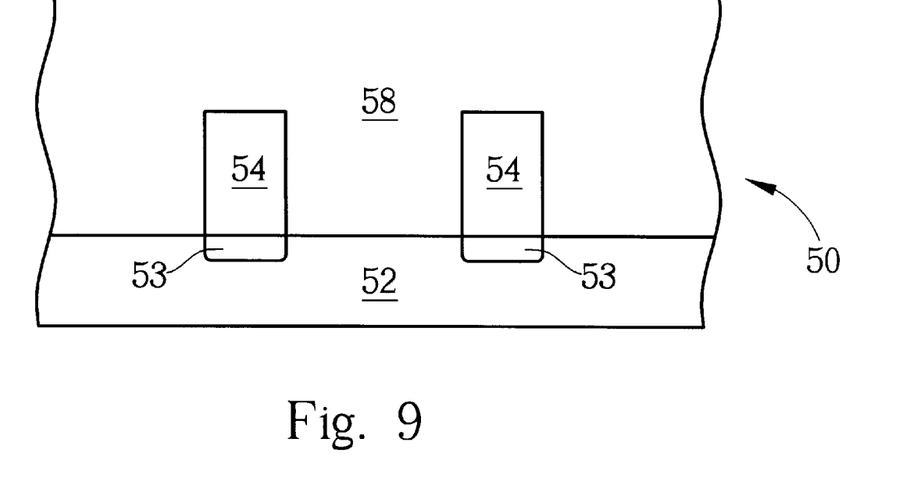

As shown in FIG. 9, the photoresist layer 56 is completely removed, followed by forming a dielectric layer 58 composed of silicon nitride on the surface of the substrate 52 that covers the remaining sacrificial layer 54. A chemical mechanical polishing (CMP) process is used for leveling the surface of the dielectric layer 58.

Figure 10:
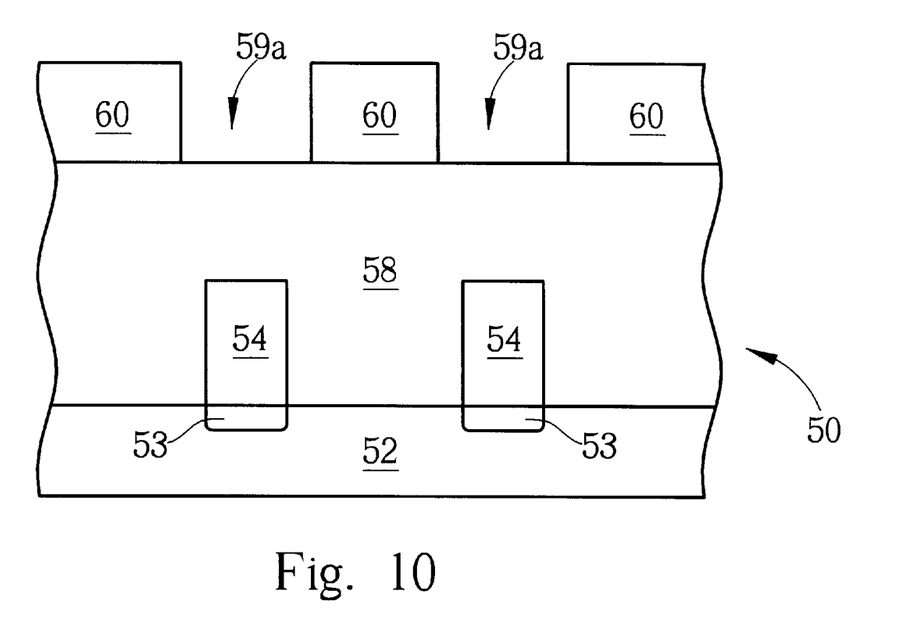
Figure 11:
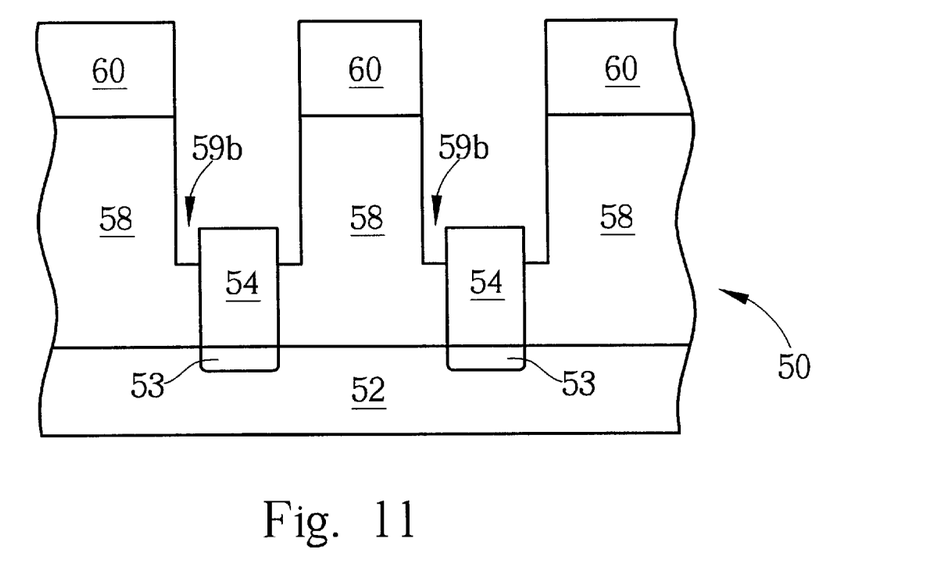
Figure 12:
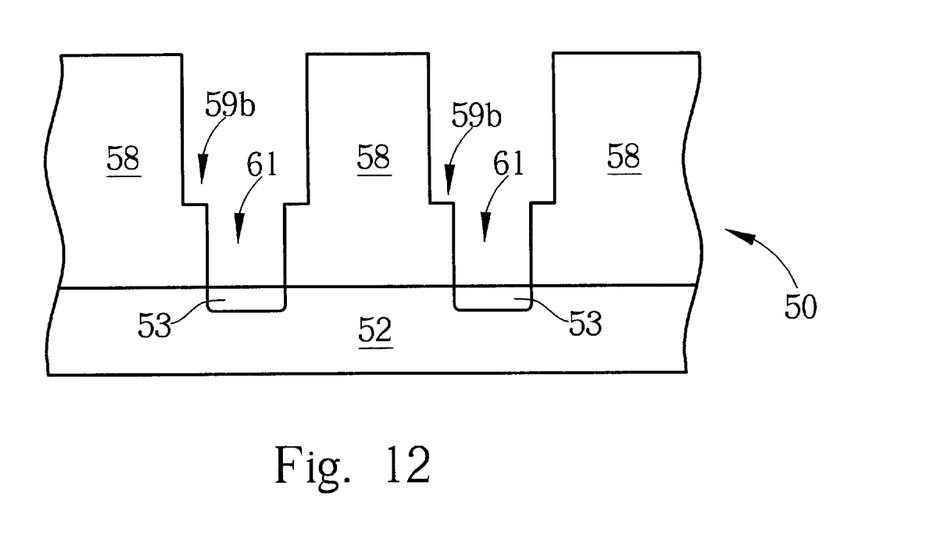

Then, as shown in FIG. 10, a photoresist layer 60 is formed on the surface of the dielectric layer 58 and a lithography process is employed to form a line-shaped opening 59a in the photoresist layer 60, positioned above the remaining sacrificial layer 54. As shown in FIG. 11, a dry-etching process is performed to etch portions of the dielectric layer 58 through the line-shaped opening 59a, for forming a line-shaped recess 59b, and the remaining sacrificial layer 54 protrudes from the bottom surface of the line-shaped recess 59b. As shown in FIG. 12, the photoresist layer 60 and the remaining sacrificial layer 54 are completely removed to form a plug hole 61 in the bottom of the line-shaped recess 59b. A wet-etching process, using hydrofluoric acid (HF) as an etching solution, removes the remaining sacrificial layer 54.

Figure 13:
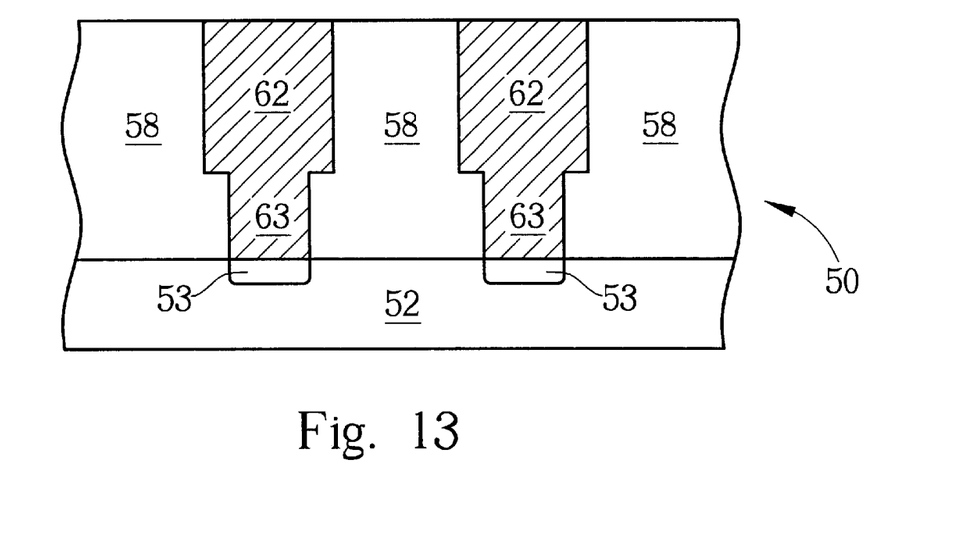

Finally, as shown in FIG. 13, a metal layer (not shown) is formed on the surface of the semiconductor wafer 50 and fills the line-shaped recess 59b and the plug hole 61. A CMP process removes the metal layer positioned on the top surface of the dielectric layer 58 for aligning the upper surface of the metal layer with the surface of the dielectric layer 58 resulting in a metal conductive wire 62 and a conductive plug 63 being formed in the line-shaped recess 59b and in the plug hole 61. The metal conductive wire 62 coupled with the conductive plug 63 are defined as a dual damascene structure.

Figure 14:
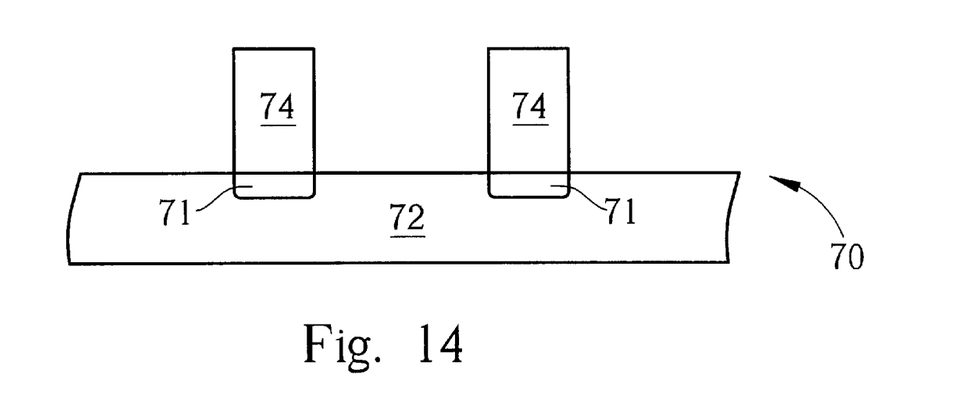
FIG. 14 to FIG. 18 are schematic diagrams of a second embodiment of the present invention method for forming a dual damascene structure.

Please refer to FIG. 14 to FIG. 18. FIG. 14 to FIG. 18 are schematic diagrams of a second embodiment of the present invention method for forming a dual damascene structure. As shown in FIG. 14, the semiconductor wafer 70 comprises a substrate 72 and a conductive area 71 positioned on a predetermined area of the substrate 72. The conductive area 71 may be a metal conductive wire or a landing pad.

Figure 15:
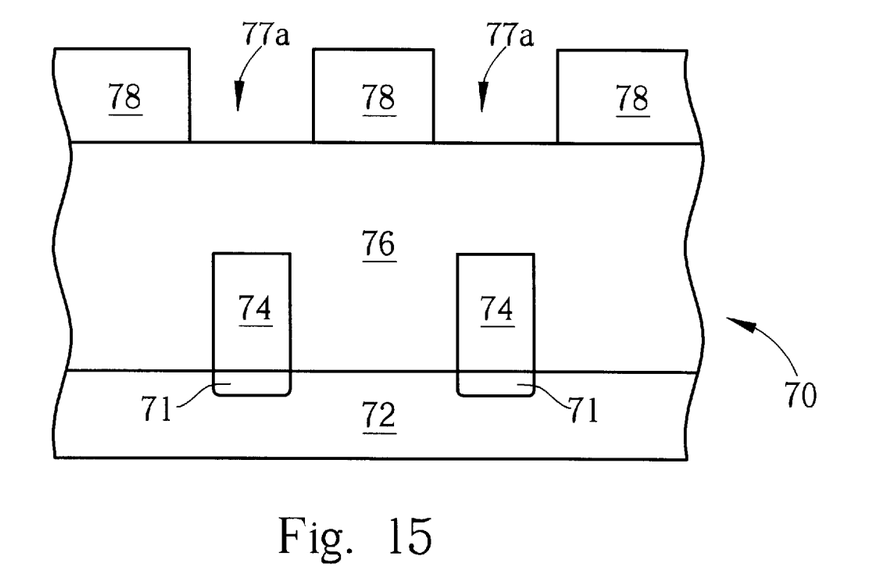

The method of a second embodiment of the present invention is to first form at least two patterned photoresist layers 74 on the substrate 72, with each photoresist layer 74 respectively positioned above the conductive area 71. Then, as shown in FIG. 15, a dielectric layer 76 composed of silicon oxide or silicon nitride is formed and covers the patterned photoresist layer 74. A CMP process is used for leveling the surface of the dielectric layer 76. Another photoresist layer 78 is formed on the dielectric layer 76, and a lithography process is performed to form at least two line-shaped openings 77a in the photoresist layer 78, with each line-shaped opening 77a positioned above the patterned photoresist layer 74.

Figure 16:
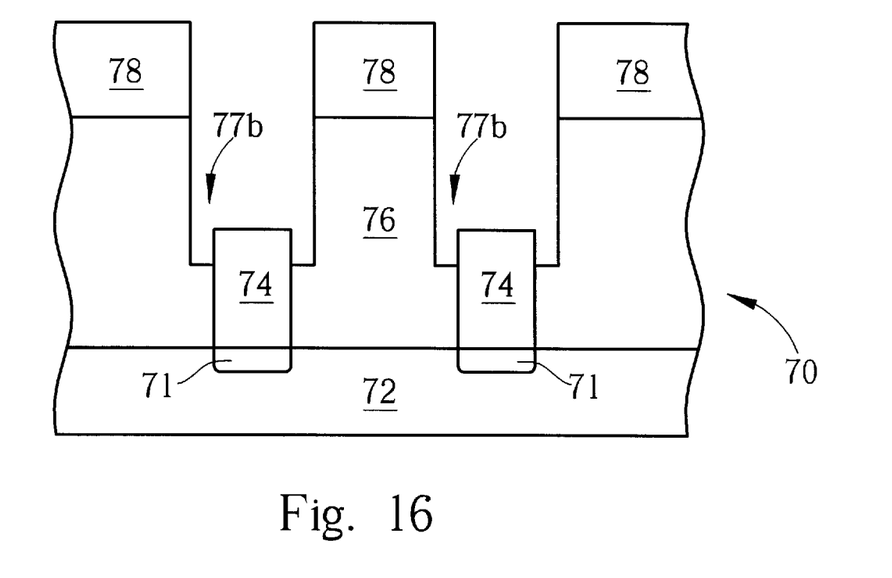
Figure 17:
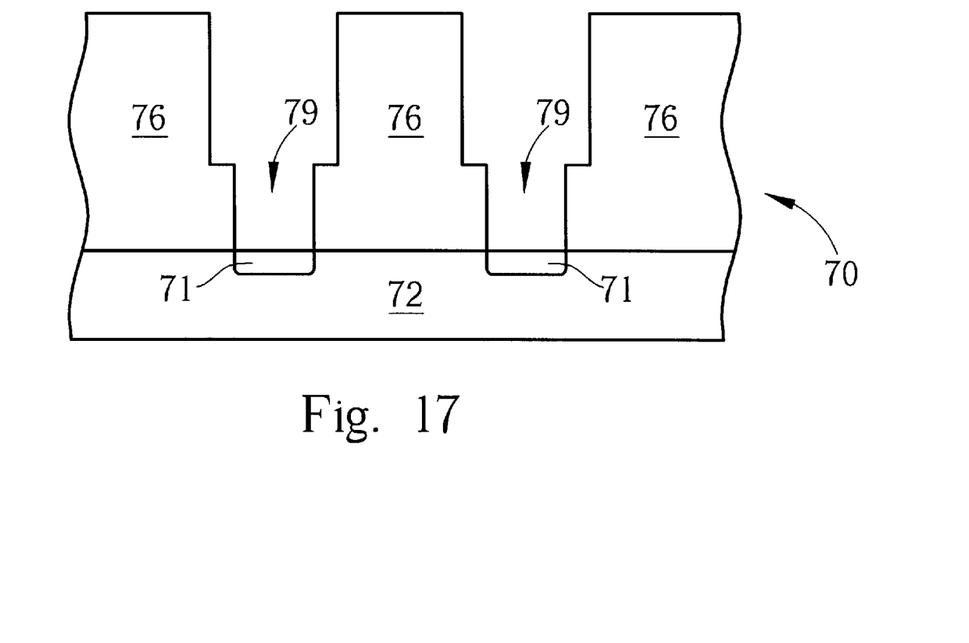

As shown in FIG. 16, a dry-etching process is performed to etch portions of the dielectric layer 76 through the line-shaped opening 77a for forming a line-shaped recess 77b, until the patterned photoresist layer 74 protrudes from the bottom surface of the line-shaped recess 77b. As shown in FIG. 17, a process for removing both photoresist layers is performed, simultaneously removing the photoresist layer 78 and the patterned photoresist layer 74, so forming a plug hole 79 in the bottom of the line-shaped recess 77b.

Figure 18:
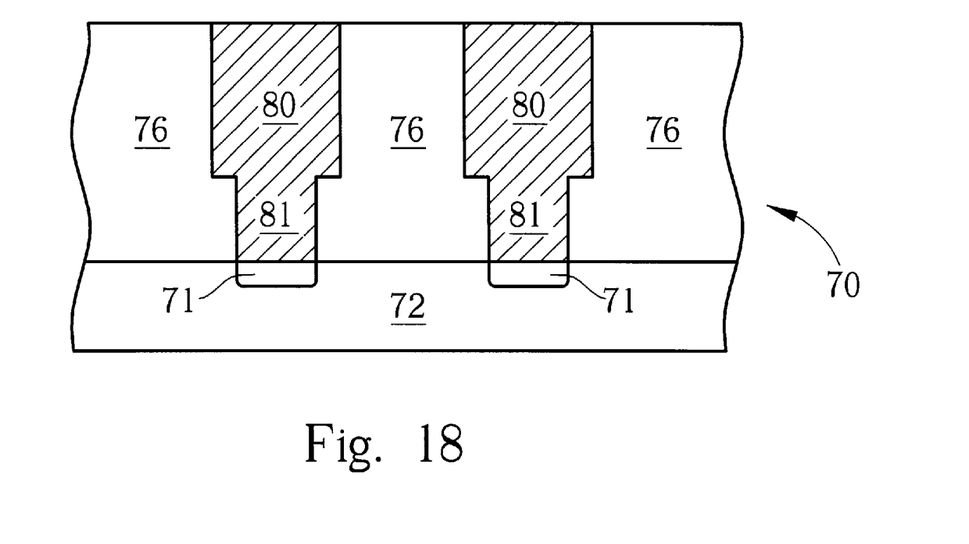

Finally, as shown in FIG. 18, a metal layer (not shown) is formed on the surface of the semiconductor wafer 70 and fills the line-shaped recess 77b and the plug hole 79. A CMP process is then employed to remove the metal layer positioned on the top surface of the dielectric layer 76 for aligning the upper surface of the metal layer with the surface of the dielectric layer 76. A metal conductive wire 80 and a conductive plug 81 are thus formed in the line-shaped recess 77b and in the plug hole 79. The metal conductive wire 80 coupled with the conductive plug 81 are defined as a dual damascene structure.

Figure 19:
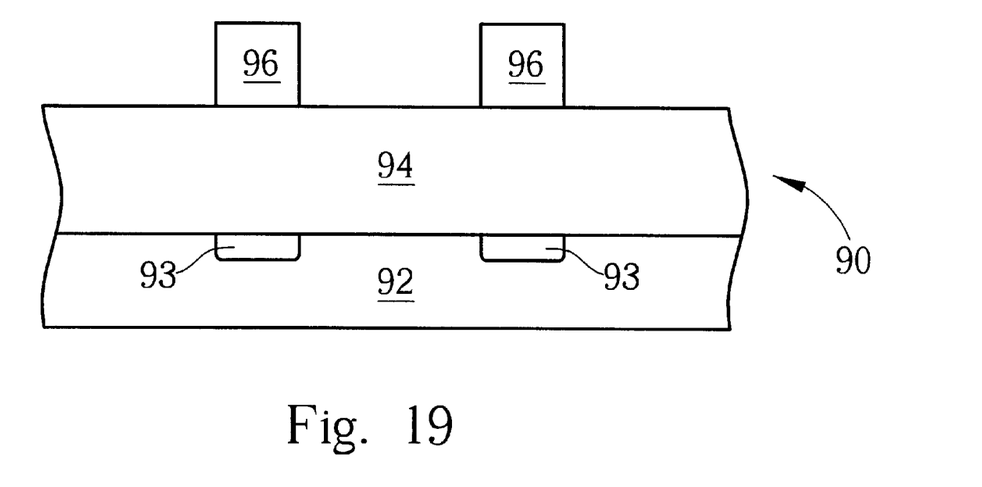
FIG. 19 to FIG. 24 are schematic diagrams of a third embodiment of the present invention method for forming a damascene structure.

Please refer to FIG. 19 to FIG. 24. FIG. 19 to FIG. 24 are schematic diagrams of a third embodiment of the present invention method for forming a damascene structure. As shown in FIG. 19, a semiconductor wafer 90 comprises a substrate 92 and a conductive area 93 positioned on a predetermined area of the substrate 92. The conductive area 93 may be a metal conductive wire or a landing pad. The method of the third embodiment of present invention is to first form a conductive layer 94 composed of a metal layer or a doped polysilicon layer on the substrate 92, covering the conductive area 93. Then, a patterned photoresist layer 96 is formed on the conductive layer 94 and is positioned above the conductive area 93.

Figure 20:
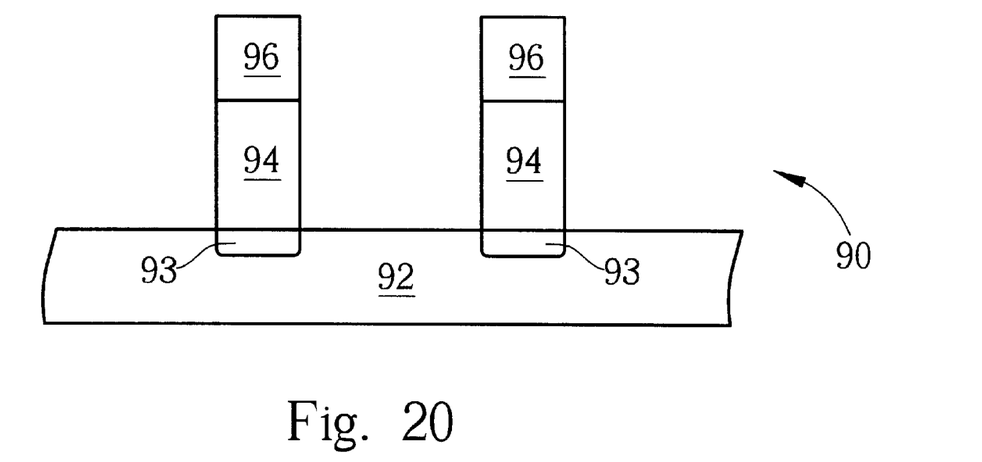
Figure 21:
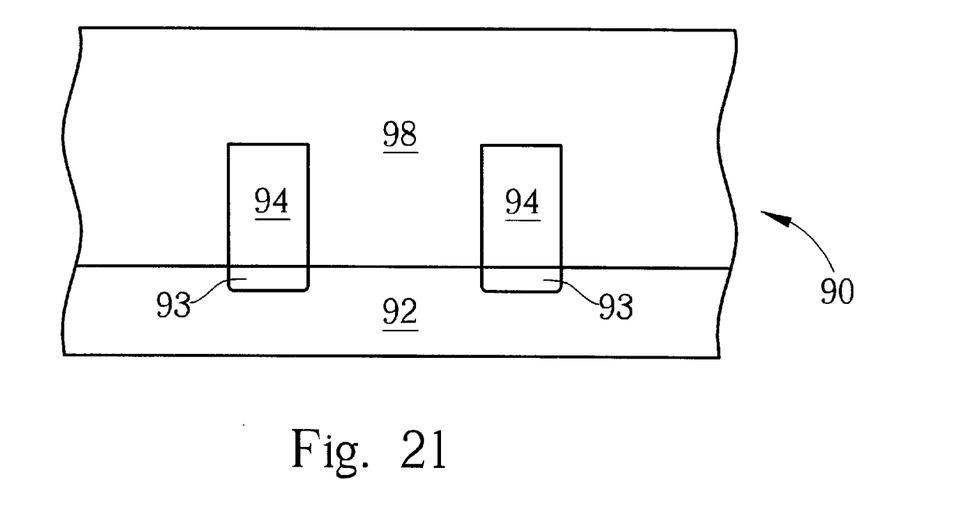
Figure 22:
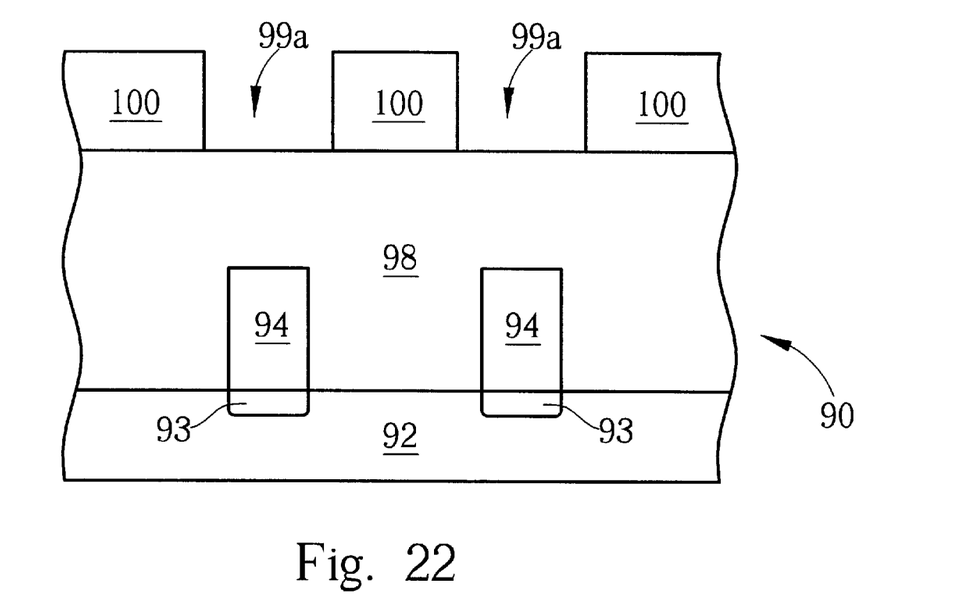

As shown in FIG. 20, a dry-etching process is performed to remove the conductive layer 94 not covered by the photoresist layer 96. As shown in FIG. 21, the photoresist layer 96 is completely removed, and a dielectric layer 98 composed of silicon oxide or silicon nitride is formed on the substrate 92, covering the remaining conductive layer 94. A CMP process is used for leveling the surface of the dielectric layer 98. Then, as shown in FIG. 22, another photoresist layer 100 is formed on the dielectric layer 98, and a lithography process is performed to form a line-shaped opening 99a in the photoresist layer 100, the line-shaped opening 99a positioned above the remaining conductive layer 94.

Figure 23:
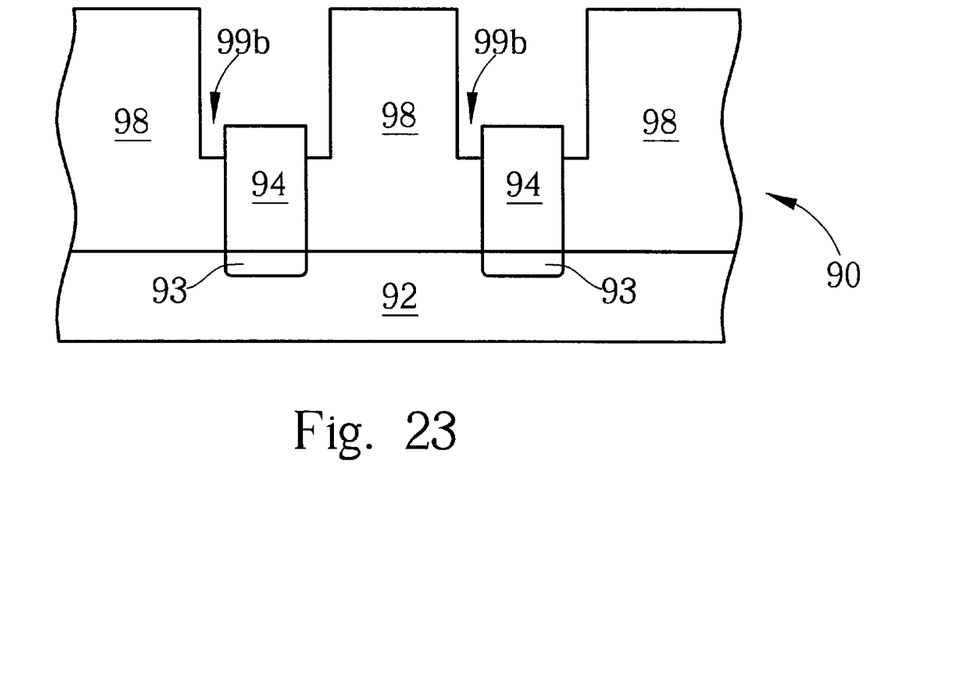
Figure 24:
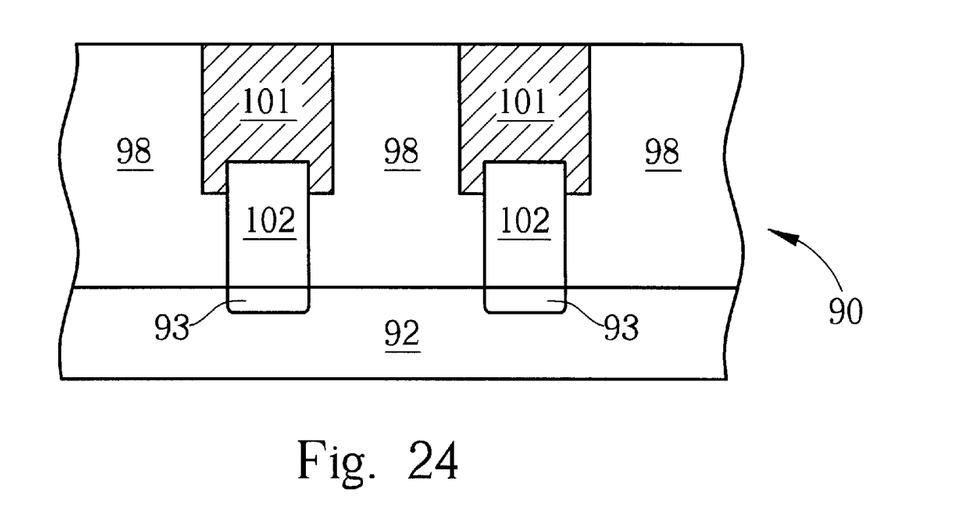

As shown in FIG. 23, a dry-etching process is performed to etch portions of the dielectric layer 98 through the line-shaped opening 99a for forming a line-shaped recess 99b so as to make the remaining conductive layer 94 protrude from the bottom surface of the line-shaped recess 99b. Finally, as shown in FIG. 24, the photoresist layer 100 is completely removed and a metal layer (not shown) is formed on the surface of the semiconductor wafer 90, filling the line-shaped recess 99b for connecting the metal layer and the remaining conductive layer 94. A CMP process is performed to remove the metal layer positioned on the top surface of the dielectric layer 98 for aligning the upper surface of the metal layer with the surface of the dielectric layer 98. A metal conductive wire 101 and a conductive 102 composed of conductive layer 94 are thus formed, and define a damascene structure.

The method of the present invention for forming a dual damascene structure on a semiconductor wafer is to first form a patterned sacrificial layer on the substrate, followed by a dielectric layer above the sacrificial layer. Then, a line-shaped recess is etched in the dielectric layer so as to connect the patterned sacrificial layer with the line-shaped recess. Finally, the sacrificial layer is removed to form a plug hole, and a metal layer is formed to fill the line-shaped recess and the plug hole to form a metal conductive wire and a conductive plug. The metal conductive wire coupled with the conductive plug is defined as a dual damascene structure.

In contrast to the prior art method of forming the dual damascene structure on the semiconductor wafer, the present invention prevents the overhang problem from occurring when filling a metal layer in the plug hole, which would otherwise result in the formation of voids in the plug hole and an increase in the resistance of the plug. Furthermore, the present invention method can also prevent an unstable electrical current occurring in the dual damascene structure that can affect the electrical performance of the integrated circuit. As well, the present invention can accurately control the critical dimension of the plug hole in each dual damascene structure.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a dual damascene structure on a semiconductor wafer, the semiconductor wafer comprising a substrate, a conductive area positioned on a predetermined area of the substrate, and a patterned first photoresist layer positioned on the substrate above the conductive area, the method comprising:

forming a dielectric layer that covers the patterned first photoresist layer, and forming a second photoresist layer positioned on the dielectric layer;

performing a lithography process to form a line-shaped opening in the second photoresist layer positioned above the patterned first photoresist layer;

performing a dry-etching process to etch portions of the dielectric layer through the line-shaped opening to form a line-shaped recess, the patterned first photoresist layer protruding from a bottom surface of the line-shaped recess;

simultaneously removing the second photoresist layer and the patterned first photoresist layer to form a plug hole in the bottom of the line-shaped recess;

forming a metal layer on the surface of the semiconductor wafer that fills the line-shaped recess and the plug hole for respectively forming a metal conductive wire and a conductive plug, the metal conductive wire coupled with the conductive plug defining a dual damascene structure; and removing the metal layer positioned on a top surface of the dielectric layer.

2. The method of claim 1 comprising a chemical mechanical polishing (CMP) process for leveling the top surface of the dielectric layer.

3. The method of claim 1 wherein a chemical mechanical polishing (CMP) process is used to remove the metal layer positioned on the top surface of the dielectric layer to align an upper surface of the metal conductive wire with the top surface of the dielectric layer.

4. The method of claim 1 wherein the dielectric layer is composed of silicon oxide or silicon nitride.

\* \* \* \* \*